310-800 SR
XR 3,798,473
X 87966

United States Patent [19]

Murayama et al.

[11] 3,798,473

[45] Mar. 19, 1974

[54] POLYMER TYPE ELECTROACOUSTIC TRANSDUCER ELEMENT

[75] Inventors: Naohiro Murayama; Kenichi Nakamura, both of Fukushima, Japan

[73] Assignee: Kureha Kagaku Kogyo Kabushiki Kaisha, Tokyo, Japan

[22] Filed: Nov. 6, 1972

[21] Appl. No.: 303,758

[30] Foreign Application Priority Data

Nov. 5, 1971 Japan ........................... 46-87607

[52] U.S. Cl. ........................ 310/8, 310/8.2, 310/8.3, 310/9.5

[51] Int. Cl. ......................... H01v 7/02, H04r 17/00

[58] Field of Search ............................... 310/8–8.3, 310/8.5, 8.6, 9.5, 9.6; 179/110.1 A; 252/62.9

[56] References Cited

UNITED STATES PATENTS

| | | | |
|---|---|---|---|
| 2,320,887 | 6/1943 | Read | 310/8.2 |
| 2,589,403 | 3/1952 | Kurie | 310/8.2 X |
| 3,209,176 | 9/1965 | Paley | 310/8.2 |

FOREIGN PATENTS OR APPLICATIONS

| | | | |
|---|---|---|---|
| 1,902,849 | 9/1969 | Germany | 310/9.5 |
| 4,521,344 | 1/1968 | Japan | 310/8.3 |

OTHER PUBLICATIONS

Chemical Abstract, 35–Synthetic High Polymers, Vol. 67, 1967 pp. 73962.

*Primary Examiner*—Gerald Goldberg
*Assistant Examiner*—Mark O. Budd
*Attorney, Agent, or Firm*—Sughrue, Rothwell, Mion, Zinn & Macpeak

[57] ABSTRACT

A piezoelectric type electroacoustic transducer element having a high sensitivity in a high frequency region is composed of a piezoelectric polymer sheet having on one surface thereof a backing of a material having a larger elasticity (Young's Modulus) and mass than the elasticity and mass of the piezoelectric polymer sheet.

15 Claims, 3 Drawing Figures

POLYMER TYPE ELECTROACOUSTIC TRANSDUCER ELEMENT

BACKGROUND OF THE INVENTION

1. Field of the Invention

The present invention relates generally to a piezoelectric polymer type electroacoustic transducer element and, more particularly, it relates to an acoustic transducer element having a high sensitivity in a high frequency region.

2. Description of the Prior Art

Hitherto, a piezoelectric electrostriction element has been used as an oscillator. Although those inorganic oscillators have the advantages that the resonance point of the oscillator is determined by the thickness of the inorganic oscillator and the oscillator can be used in a high frequency region corresponding to the resonance point, it has the disadvantage that the electric circuits become complicated in using such an inorganic oscillator and a piezoelectric electrostriction substance having a quite large Q value, such as quartz or barium titanate, is used in only a definite resonance frequency region.

Recently, it has been found that high molecular weight compounds such as poly- γ-methyl-L-glutamate and polyvinylidene fluoride have a quite high piezoelectricity and investigations on the use of such a piezoelectric polymer as an oscillator for electroacoustic transducers have been made. When such a piezoelectric polymer sheet is used for microphones, speakers, etc., by fixing the periphery of the polymer sheet, the polymer sheet oscillates freely in the direction perpendicular to the face of the sheet due to the quite low elasticity of the polymer itself to cause, therefore, expansion or bending due to sound pressure or an electric signal. Accordingly, when such a piezoelectric polymer is used, it is considered that expansion and contraction type or bending type piezoelectricity is mainly utilized.

It has been discovered that the acoustic transducer utilizing the free oscillation or vibration of such a piezoelectric polymer sheet operates in a wide range of frequencies and acts effectively in an audio frequency region having comparatively large amplitudes but has the fault that the output of the device decreases as the frequency increases in the high frequency region.

SUMMARY OF THE INVENTION

The inventors have discovered that a piezoelectric element, which is highly sensitive in a high frequency region, can be obtained by backing one surface of a piezoelectric polymer sheet with a material having a larger elasticity (Young's Modulus) and mass than the elasticity and mass of the piezoelectric polymer preventing, thereby, the free oscillation or vibration of the piezoelectric polymer sheet. Hitherto, expansion piezoelectricity has mainly been investigated in regard to the electro-mechanical transducing effect of a piezoelectric polymer and further bending piezoelectricity has only been investigated slightly. However, it would not have been anticipated that by hindering the expanding and bending movements of a piezoelectric polymer sheet, a high electro-mechanical transducing effect would be obtained.

Thus, according to the present invention, there is provided a piezoelectric-type electroacoustic transducer element in which one surface of a piezoelectric polymer sheet is backed by a material having a larger elasticity and mass than the elasticity and mass of the piezoelectric polymer and only the opposite surface of the polymer sheet is utilized as the stress-acting surface.

BRIEF DESCRIPTION OF THE ACCOMPANYING DRAWINGS

Now the present invention will be explained by reference to the accompanying drawings, in which FIG. 1 is a schematic view showing an embodiment of the electro-acoustic transducer element of this invention;

FIG. 2 is a schematic view showing another embodiment of the electroacoustic transducer element of this invention; and FIG. 3 is a block diagram showing the testing of the properties of the electroacoustic transducer element of this invention.

DETAILED DESCRIPTION OF PREFERRED EMBODIMENTS

Figure 1:
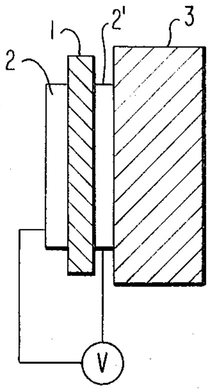
Figure 2:
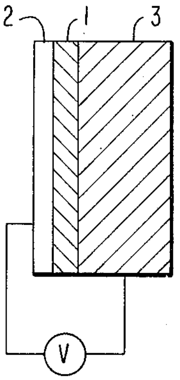

In FIG. 1, a piezoelectric polymer sheet 1 has electrodes 2 and 2' made of aluminum, gold, copper, graphite, etc., vacuum-deposited on the both surfaces of the sheet and the outer surface of the electrode 2' has been attached to a plate 3 of a material having a high elasticity such as a metal or glass, plate 3 having a comparatively thick thickness. Or, alternatively, as shown in FIG. 2, a thin film electrode 2 is formed on only one surface of a piezoelectric polymer sheet 1 and a plate 3 having a comparatively thick thickness and made of a conductive material having a high elasticity, such as a metal or graphite is directly attached to the other surface of the sheet. The thickness of the layer 2 of the conductive material such as aluminum vacuum-coated on the surface of the piezoelectric element 1 is very thin and also the weight or mass of the layer is less. Thus, even if the elasticity of the conductive layer, such as an aluminum layer is large, the free expansion and contraction movement or bending movement of the piezoelectric polymer sheet is not hindered but the surface of the polymer sheet on which a plate 3 having large elasticity and mass has been attached as a backing plate is restricted in the expansion and contraction movement.

The piezoelectric element described above is used in the same manner as in using conventional piezoelectric elements for electroacoustic transducers. That is, when waves from an acoustic system are applied onto the electrode 2 of the piezoelectric element, changes in electrostatic charges form between both electrodes in response to the changes of the sonic waves and the changes of charges can be delivered as waves to an electric system. Also, on the contrary, when an alternating current is applied between both electrodes of the piezoelectric element, sonic waves are obtained from the surface of the electrode 2.

The features of the piezoelectric type electroacoustic transducer element of this invention include those that the electroacoustic transducing effect thereof is high in a high frequency region and thus the electroacoustic transducing element can be used even in an ultrasonic wave region in which the output of a conventional free-oscillation type electroacoustic transducer element is too small to be used practically and that a piezoelectric element having any desired shape, such as an element having a wide area, a bent element, or an element having a complicated shape can be obtained since the material of the element is a polymer and further the element can be used over wide sonic ranges.

It would not have been believed from conventional knowledge and understanding of piezoelectric polymers that, in spite of the electroacoustic transducer element of this invention of which the expansion and contraction movement in the plane of the piezoelectric polymer is almost hindered, it would have a higher transducing effect than that of a free-bending type or a free expansion and contraction type piezoelectric polymer element in a high frequency sonic region. The reason is not yet completely understood but it is believed to be based on the fact that, since the electroacoustic transducer element of this invention is backed by a solid material and the free oscillation or vibration thereof is restricted, the deformation of the piezoelectric polymer film in the thickness direction occurs effectively due to the stress of the sound pressure applied to the direction of plane and further the piezoelectricity in the thickness direction is quite high.

As the piezoelectric polymers in this invention, any known polymers having piezoelectricity may be used but, in particular, polyvinylidene fluoride or a copolymer of vinylidene fluoroide and a monomer copolymerizable with vinylidene fluoride, such as tetrafluoroethylene, trifluoroethylene, vinyl fluoride, chlorotrifluoroethylene, vinylidene fluorochloride, or propylene hexafluoride, provides a piezoelectric substance having a high piezoelectricity. A piezoelectricity polymer sheet prepared from a uni-axially oriented sheet of the polymer or the copolymer as described above or an electret prepared from a uni-axially oriented sheet of the polymer or the copolymer has a high piezoelectricity in the thickness direction than above and thus it is most advantageous to use the piezoelectric element prepared from the oriented sheet of polyvinylidene fluoride or the vinylidene fluoride copolymer.

Moreover, since the Modulus elasticity (Young's Modulus) of such polymers is generally between $1\times10^3$ kg/cm$^2$ and $2\times10^4$ kg/cm$^2$, any substance having a Young'Modulus beyond the above range may be used as the backing. Preferably, such a substance is one having a Young's Modulus 10 times higher than that of polymers, namely, $1\times10^5$ kg/cm$^2$. Such materials as metal, insulator, earthenware, porcelain, graphite are preferable for the backing substance, whose Young's Modulus are all between $1\times10^5$ kg/cm$^2$ and $1\times10^7$ kg/cm$^2$. Furthermore, if an insulator such as porcelain, earthenware, insulator is used for the backing substance, it is necessary to provide a conductive layer between the polymer and the backing substance as shown in FIG. 1. In addition, the thicker the piezoelectric polymers become, the larger the piezoelectricity exhibited in the thickness direction. However, excessively thick piezoelectric substances are difficult to produce, so that a piezoelectric polymer film whose thickness is from 4 $\mu$ 500 $\mu$ is generally used.

In addition, a thin film electrode of metal or graphite etc., is attached onto another surface of the piezoelectric polymers and the electrode is required to be as small in mass as possible so as not to hinder the vibration of piezoelectric polymers very much, and then it is preferable that the value obtained by multiplying the "mass" by the "Young's Modulus" be smaller than the Young's Modulus of piezoelectric polymers, that is, it is generally from one-tenth to one-thousandth.

Now the invention will also be explained by reference to the following example but the invention is not to be interpreted as being limited thereto.

EXAMPLE

A polyvinylidene fluoride sheet (Young's Modulus $1.2\times10^4$ kg/cm$^2$) of 300 microns in thickness obtained by extrusion through a T-die was stretched in one direction and a circular sheet having a diameter of 26 mm was cut from the polymer sheet. Aluminum was vacuum-deposited (0.01 $\mu$ thickness) on one surface of the circular sheet and further a circular copper plate having a thickness of 10 mm. and a diameter of 25 mm was attached to the opposite surface using an epoxy adhesive. An electric potential of 700 kv/cm. D.C. was applied to the copper plate and the aluminum layer of the polymer sheet for 30 minutes in a chamber maintained at 90°C, and then the assembly was cooled to room temperature while applying the D.C. potential followed by removing the electric potential to provide a piezoelectric element as shown in FIG. 2.

Figure 3:
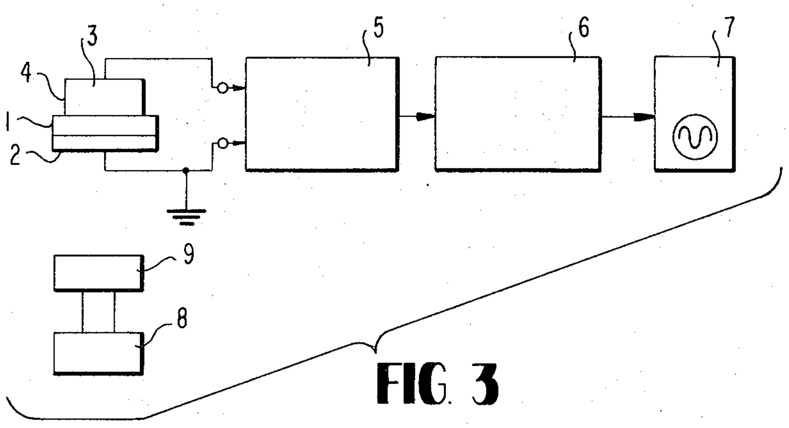

The electroacoustic transducer element of this invention thus prepared was used to construct a system shown in the block diagram of FIG. 3. As shown in FIG. 3, a barium titanate oscillator 9 having a resonance point of 200 KHz connected to USY-150 V type wide range ultrasonic generator (made by Ultrasonic Industry Co.) 8 was disposed facing the aluminum electrode 2 of the piezoelectric element 4. The electroacoustic transducer element was connected to an MS-5103 B type Memoryscope (made by Iwasaki Tsushin K.K.) 7 through an impedance transformer circuit 5 using FET transistors and a high-pass filter circuit 6 and the output voltages and the wave forms were observed by means of the device 7.

When the output of the ultrasonic generator 8 was 60 watts and the distance between the oscillator 9 and the aluminum electrode 2 in air was 2 cm., the output from the piezoelectric element 4 was 18 millivolts peak to peak and also a clear wave form the same as that from the generator was observed as the output wave form.

In addition, when the aluminum was vacuum-deposited onto both surfaces of the uni-axially oriented sheet of polyvinylidene fluoride, a free-oscillation type piezoelectric element having the same area as described above was prepared by applying the same electric potential as described above under the same conditions, and the same test as above was conducted using the piezoelectric element in place of the aforesaid piezoelectric element of this invention, an output of 0.6 millivolt only was obtained under the same conditions and further noise occurred greatly and the wave form observed fluctuated.

While the invention has been particularly shown and described with reference to preferred embodiments thereof, it will be understood by those skilled in the art that various changes in form and details may be made therein without departing from the spirit and scope of the invention.

What is claimed is:

1. A piezoelectric electroacoustic transducer element comprising a piezoelectric polymer sheet comprising piezoelectric polyvinylidene fluoride having on one surface thereof a backing of a material having a larger elastic modulus (Young's Modulus) and mass than the elasticity and mass of said piezoelectric polymer, the opposite surface of said sheet being used as the pressure-acting surface.

2. The piezoelectric electroacoustic transducer element as claimed in claim 1, where in said piezoelectric polymer sheet is a piezoelectric polyvinylidene fluoride sheet.

3. The piezoelectric electroacoustic transducer element as claimed in claim 1, wherein said piezoelectric polymer sheet is a piezoelectric polymer sheet of a copolymer of vinylidene fluoride and a monomer copolymerizable therewith, wherein said monomer copolymerizable therewith is selected from the group consisting of ethylene tetrafluoride, ethylene trifluoride, vinylfluoride, trifluoroethylenechloride, monochlorovinylidene fluoride or propylene hexafluoride.

4. The piezoelectric electroacoustic transducer element as claimed in claim 1, wherein said backing material is a metal or glass of a large thickness.

5. The piezoelectric electroacoustic transducer element as claimed in claim 1, wherein said backing material is attached to one surface of said piezoelectric polymer sheet through a thin electrode layer formed on the surface thereof.

6. The piezoelectric electroacoustic transducer element as claimed in claim 1, wherein said backing material is attached directly to one surface of said piezoelectric polymer sheet.

7. The piezoelectric electroacoustic transducer element as claimed in claim 1, wherein said piezoelectric polymer sheet has a thin electrode on one surface thereof and said backing of the material is a thick electrode having a larger elastic modulus (Young's Modulus) and mass than the elasticity and mass of said piezoelectric polymer.

8. The piezoelectric electroacoustic transducer element as claimed in claim 1, wherein said piezoelectric polymer sheet has thin electrodes on both surfaces of said sheet and said backing of the material is an electric insulator having a larger elastic modulus (Young's Modulus) and mass than the elasticity and mass of said piezoelectric polymer.

9. The piezoelectric electroacoustic transducer element as claimed in claim 1 wherein said polymer sheet is uniaxially oriented.

10. The piezoelectric electroacoustic transducer element as claimed in claim 1 wherein the elastic modulus (Young's Modulus) of said polymer sheet is between $1 \times 10^3 kg/cm^2$ and $2 \times 10^4 kg/cm^2$.

11. The piezoelectric electroacoustic transducer element as claimed in claim 10 wherein said material of said backing has an elastic modulus (Young's Modulus) of between $1 \times 10^5 kg/cm^2$ and $1 \times 10^7 kg/cm^2$.

12. The piezoelectric electroacoustic transducer element as claimed in claim 10 wherein said piezoelectric polymer sheet has a thickness of from 4 $\mu$ to 500 $\mu$.

13. The piezoelectric electroacoustic transducer element as claimed in claim 11 wherein said opposite surface of said sheet used as the pressure-acting surface has a thin film electrode attached thereto, the thin film electrode exhibiting a value obtained by multiplying its mass by its Young's Modulus smaller than the Young's Modulus of said piezoelectric polymer sheet.

14. The piezolectric electroacoustic transducer of claim 13 wherein said value is from one-tenth to one-thousandth.

15. The piezoelectric electroacoustic transducer of claim 1 where the piezoelectric polymer sheet consists essentially of piezoelectric polyvinylidene fluoride or a piezoelectric oopolymer thereof with a monomer copolymerizable therewith, wherein said monomer copolymerizable therewith is selected from the group consisting of ethylene tetrafluoride, ethylene trifluoride, vinylfluoride, trifluoroethylenechloride, monochlorovinylidene fluoride or propylene hexafluoride.

* * * * *